United States Patent [19]

Zucker

[11] 3,872,410

[45] Mar. 18, 1975

[54] SURFACE WAVE FILTER FOR TV IF STAGE

[75] Inventor: Joseph Zucker, Peabody, Mass.

[73] Assignee: GTE Laboratories Incorporated, Waltham, Mass.

[22] Filed: Jan. 11, 1974

[21] Appl. No.: 432,704

Related U.S. Application Data

[63] Continuation of Ser. No. 312,080, Dec. 4, 1972, abandoned.

[52] U.S. Cl. ...................... 333/72, 310/8.1, 310/9.8, 333/30 R

[51] Int. Cl. ........ H03h 9/02, H03h 9/26, H03h 9/32

[58] Field of Search ......... 333/30 R, 72; 330/5, 5.5, 330/30 D; 310/8, 8.1, 9.8

[56] References Cited

UNITED STATES PATENTS

| | | | |
|---|---|---|---|
| 3,582,840 | 6/1971 | De Vries | 333/72 |
| 3,750,027 | 7/1973 | Hartmann | 333/72 X |

*Primary Examiner*—James W. Lawrence
*Assistant Examiner*—Marvin Nussbaum
*Attorney, Agent, or Firm*—Irving M. Kriegsman; Leslie J. Hart

[57] ABSTRACT

Increased selectivity is accomplished by arranging the input and output transducers of an acousto-electric surface-wave filter in series on a common piezoelectric substrate. Undesired signal feed-through due to inherent coupling between the input and output transducers is substantially attenuated by symmetrically arranging two output transducers on opposite sides of the input transducer such that the output transducers are mirror images of one another about the midline of the central input transducer, with one side of the input transducer common and grounded to the opposite sides of the output transducer. When processed by a differential amplifier, the symmetry of the grounds and outputs with respect to the input allows the capacitively and/or inductively coupled signals to be canceled while the signal due to the surface acoustic wave is enhanced. An increase in the selectivity of the filter by reducing the sidelobe amplitude is accomplished by setting the number of finger pairs of the input transducer equal to three halves times the number of finger pairs in the output transducer.

15 Claims, 2 Drawing Figures

PATENTED MAR 18 1975

3,872,410

SURFACE WAVE FILTER FOR TV IF STAGE

This is a continuation, of application Ser. No. 312,080 filed Dec. 4, 1972, now abandoned.

BACKGROUND OF THE INVENTION

The present invention pertains to discrimination circuitry. More particularly, it relates to surface acoustic wave filters with output transducers symmetrically arranged about the input transducer.

It is known that an electrode array composed of a pair of interleaved comb-shaped electrodes of conductive teeth at alternating potentials may be utilized to launch acoustic surface waves in a piezoelectric medium. In the simplified embodiment of a piezoelectric ceramic wafer poled perpendicularly to the propagating surface, the waves travel at right angles to the electrode segments; in crystalline materials, the waves may travel at an acute angle to the elements, the particular angle in a given case being a function of the crystallography of the material relative to the configuration of the array.

The surface waves are converted back into an electrical signal by a similar array of conductive teeth coupled to the piezoelectric medium and spaced from the input electrode array. In principle, the tooth patterns are analagous to antenna arrays. Consequently, similar signal selectivity is possible as to permit the elimination of critical and/or much larger or more cumbersome components normally associated with selective circuitry. These devices, with their small size, are particularly useful in conjunction with solid-state integrated circuitry where signal selectivity is desired. Present acousto-electric signal-transmitting devices, also known as surface wave integratable filters, have a finite distance between input and output transducers. Consequently, a finite time is required for an acoustic-wave signal to travel along the path from the input transducer to the output transducer. At the output transducer, part of the acoustic wave energy is converted to electrical energy and delivered to a load. Part of the acoustic-wave energy travels beyond the transducer, and part of the acoustic-wave energy is reflected back along the original path toward the input transducer. This latter reflected surface wave, which is smaller in magnitude than the original surface wave, intercepts the input transducer where it is again similarly reflected, further attenuated in amplitude for a third transit back along same path toward the output transducer, resulting in a diminished replica of the original surface-wave signal at the output transducer. As a result, this "triple transit" diminished replica of the original surface-wave signal arrives at the output transducer later than the original surface-wave signal, the time delay being equal to twice the time required for a surface-wave signal to transverse the path from the input transducer to the output transducer.

The effect of these reflected signals, due to the spacing between the input and output transducers, varies with the amount of time delay. If these units are used, for example, as signal-selective devices in a television intermediate frequency (IF) amplifier, the reflected signal components appear as undesirable "ghosts" in the picture. One previous method for approaching this problem has been to reduce the time delay, which is directly proportional to the distance between the input transducer and the output transducer, by placing the output transducer in close proximity to the input transducer. This approach has created difficulties because direct feed-through becomes large when the output transducer is positioned close to the input transducer. That is, with close input-output spacings, the input transducer and the output transducer are inherently coupled inductively and/or capacitively as well as acoustically through the piezoelectric medium, resulting in a loss of signal selectivity at the output of the device. It is therefore an object of the present invention to overcome these problems by symmetrically arranging the output transducer around the input transducer while providing a common ground between input and output transducer.

SUMMARY OF THE INVENTION

A solid-state transmission system constructed in accordance with the present invention includes two output transducers symmetrically arranged about an input transducer coupled to an acoustic-wave propagating medium and responsive to an applied electrical signal of a predetermined center frequency for establishing acoustic waves of a predetermined acoustic wavelength in the medium. The output transducers arranged on either side of the input transducer are coupled to the medium and spaced from the input transducer in the direction of acoustic wave propagation, each output transducer being responsive to acoustic waves in the medium for developing an electrical signal corresponding thereto. One set of combed fingers of the input transducer is grounded and electrically coupled to one set of combed fingers of each output transducer. The output transducers are mirror images of each other about the midline of the input transducer. This causes the voltage induced in one output transducer due to the surface acoustic waves generated by exciting the input transducer to be 180° out of phase with the voltage induced in the other output transducer. The symmetry of the grounds and outputs with respect to the input causes the capacitively coupled signals at the output to be in phase with one another. As a consequence, if the outputs are fed into a differential amplifier, the signal due to the surface acoustic waves are enhanced, while the capacitively coupled signals are canceled. The signal rejection at the trap frequencies is thereby enhanced even when the transducers are separated by small distances.

BRIEF DESCRIPTION OF THE DRAWINGS

The features of the present invention which are believed to be novel are set forth with particularity in the attendant claims. The invention, together with further objects and advantages thereof, may best be understood by reference to the following description taken in connection with the drawings. In the several figures, like reference numerals identify like elements:

DESCRIPTION OF THE PREFERRED EMBODIMENT

It is well known that when interleaved metallic combs (interdigital transducer or IDT) on the surface of a piezoelectric material are excited by an AC voltage, surface acoustic waves are generated which propagate bi-directionally away from the combs in a direction normal to them. When the surface acoustic waves intersect a similar IDT, surface wave acoustic energy is converted back into electrical energy. As is known in the state of the art, the efficiency with which electrical energy and acoustic energy can be converted into one another by a set of IDT's on a piezoelectric substrate is frequency dependent. The frequency of maximum efficiency and the bandwidth of a set of IDT's can be calculated accurately using the simple delta function model. According to this model, the conversion efficiency between electrical and surface acoustic wave energy is given by:

$$f(x) = (\sin X/X)^2 \quad (1)$$

where $$X = nn(f-f_0)/f_0 \quad (2)$$

in which n is the number of pairs of fingers in the IDT, $f_0$ is the synchronous frequency, $v/\lambda$, $v$ being the appropriate surface acoustic wave velocity and $\lambda$ the period of the IDT. From (1) and (2), the maximum response occurs at $f=f_0$ and the first zeros in the response straddling $f_0$ occur at $f=f_0 \pm f_0/n$. Such a response is a good representation of a bandpass filter characteristic.

Figure 1:
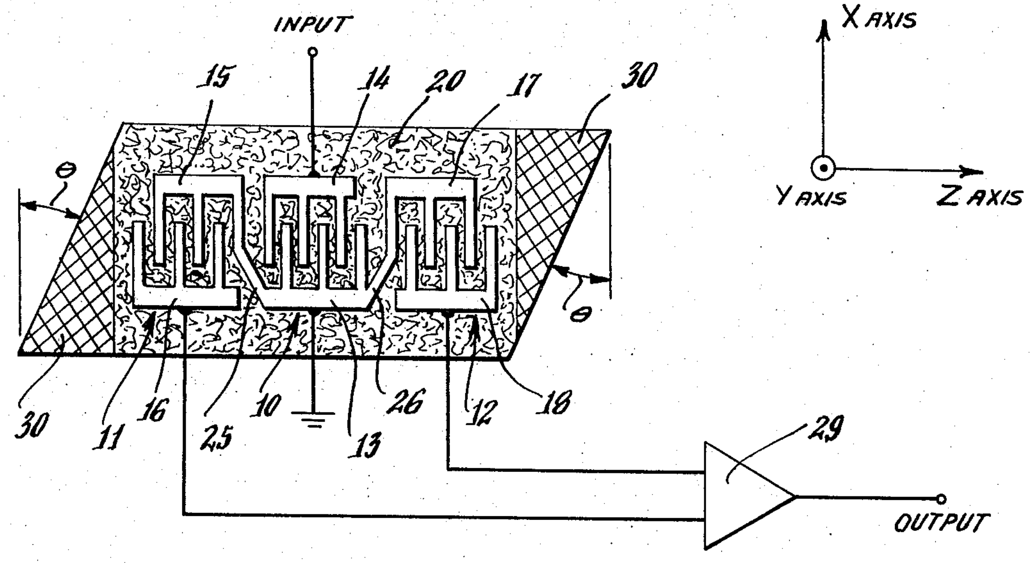
FIG. 1 is a diagrammatic representation of a filter in accordance with this invention.

Attention is directed to FIG. 1 wherein the filter in accordance with the invention is illustrated in diagrammatic form. The input signal is connected across an input transducer system generally designated by the numeral 10, mechanically coupled to one major surface of a body of piezoelectric material in the form of a substrate 20 which is capable of propagating acoustic surface waves. An output or end portion of the same surface of substrate 20 is, in turn, mechanically coupled to each of the output transducing systems, generally numerically designated 11 and 12. The output signal is established across the output transducing systems 11 and 12. Transducers 10, 11 and 12, in the simplest arrangement, are each constructed of a pair of comb-type electrode arrays or IDT. The strips of conductive elements or electrodes of one comb are interleaved with the strips of the other in each pair. The electrodes are of material such as gold or aluminum which may be vacuum deposited on a smoothly lapped and polished surface of the piezoelectric body. The input transducer system 10 comprises comb electrodes 13 and 14. The output transducer system 11 comprises comb electrodes 15 and 16 and the output transducer system 12 comprises comb electrodes 17 and 18.

Direct piezoelectric surface-wave transduction is accomplished by the spatially periodic interdigital electrodes or comb elements of the transducer. A periodic electric field is produced when a signal across the input is fed to the electrodes and through piezoelectric coupling, the electric signal is transduced to a bidirectional traveling acoustic surface wave in substrate 20. Piezo-electric material such as PZT, quartz, lithium niobate, lithium tantalate, ZnO, ZnS, or CdS; propagative of acoustic waves may be used as substrate 20. The distance between the centers of the two consecutive strips in each array is one-half the acoustic wavelength of a signal for which it is desired to achieve maximum response in that array. This occurs when the strain components produced by the electric field in the piezoelectric substrate are substantially matched to the strain components associated with the surface-wave mode. The surface waves resulting in substrate 20 in response to the energization of transducer 10 by the input signal, are transmitted bi-directionally along the substrate to the output transducers 11 and 12 where they are converted to respective electrical output signals that are superimposed across the output. A typical filter embodiment utilizes lithium niobate, oriented as indicated in FIG. 1, with the broad face perpendicular to the Y-axis and the long axis in the Z direction. This is commonly known as the YZ type of lithium niobate. The importance of the number of electrodes in the combs, the spacing between each, and the dimensions of each electrode is discussed hereinafter.

As shown in FIG. 1, electrical conductors 25 and 26 connect the lower comb elements or electrodes 14 of the central or input transducer 10 to the upper comb elements or electrodes 15 and 17 of output transducers 11 and 12 respectively. The lower comb electrodes 14 of input transducer 10 is preferably connected to a system ground; while upper input comb elements 13 are connected to the input of electromagnetic energy (not shown). The lower output comb elements 16 and 18 of output transducers 11 and 12 respectively are connected as an output to a load such as a differential amplifier. The output transducers 11 and 12 are mirror images of each other about the center line of input transducer 10. This causes the voltage induced in transducer 11 due to the surface acoustic waves generated by exciting transducer 10 to be 180° out of phase with the voltage similarly induced in transducer 12. The symmetry of the grounds and outputs with respect to the input causes the parasitic or inductively/capacitively coupled signals at 16 and 18 to be in phase with one another. As a consequence, if the output signals at 16 and 18 are fed into a differential amplifier 29, the signal due to the surface acoustic waves are enhanced, while the inductively/capacitively coupled signals or parasitic signals are canceled. The signal rejection at the trap frequencies is thereby enhanced even when the transducers are separated by relatively small distances. The ends of the substrate 20 are cut at an angle $\theta$ substantially equal to arctan 0.5, with an angle of approximately 20°–25°. The angle cut ends serve to reduce back reflections from the edges of the substrate 20. Since the back reflections are partially non-specular because of the roughness of the edges, the ends may be covered with a suitable acoustic attenuating material 30 such as black wax or epoxy.

The technique used in connecting comb elements of three transducers of a surface acoustic wave filter affects the transfer characteristic of the filter through its effect upon the amplitude of the direct feed-through signal. The differential output eliminates feed-through only if the capacitively and/or inductively coupled parasitic signal (pickup) at one output transducer is equal to that at the other transducer in phase and magnitude for all frequencies within the passband of the filter. This is the case only for a symmetrical grounding arrangement, the preferred arrangement being shown in FIG. 1. This system is topologically superior to the one in which all the comb elements on one side are connected in that the distance between the input and outputs is a maximum. The input and outputs are isolated by grounded electrodes, and the input and output are symmetrically placed with respect to ground. Care should be taken to connect the input transducer to the system ground. If either of the two output transducers are connected to the system ground, the output transducers may be unbalanced with respect to ground due to the finite resistance of the conductors connecting the comb elements. The resulting asymmetry in pickup will produce distortion in the characteristic.

Figure 2:
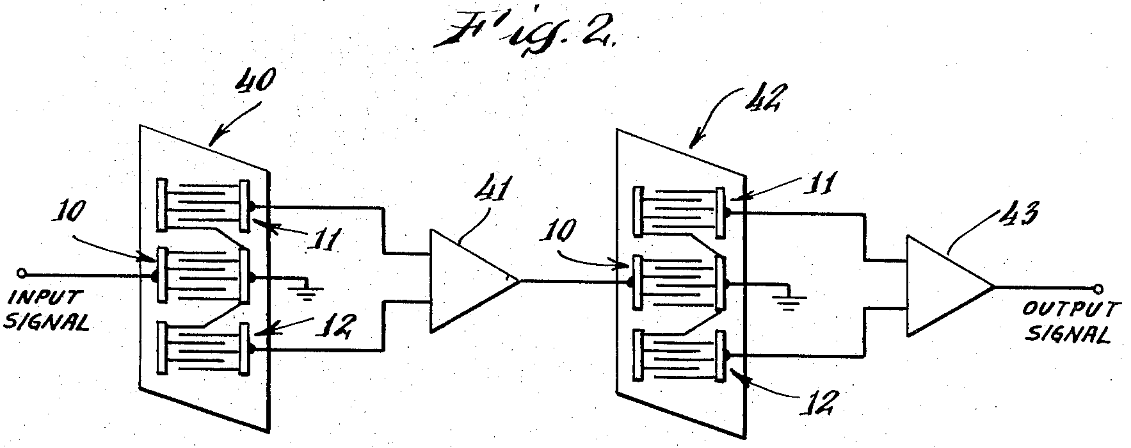
FIG. 2 is a diagrammatic representation of a series arrangement of filters in accordance with this invention.

It can be readily seen from equation 1 above that the amplitude of the first sidelobe maximum at $f = fo \pm 3fo/2n$ is approximately 27dB below the main lobe maximum. This may be too small an attenuation to meet the requirements for adjacent channel rejection. It is therefore necessary sometimes to use two similar but not identical filters of the kind shown in FIG. 1 in a series arrangement as shown in FIG. 2. Attention is now directed to FIG. 2 which illustrates a series arrangement of filters. A surface acoustic wave filter generally designated 40 of the type discussed hereinbefore is electrically connected to an input electromagnetic signal source (not shown). The output of filter 40 is electrically connected in series to a differential amplifier 41 wherein the signal due to the surface acoustic waves are enhanced and the parasitic signals are canceled. The output of amplifier 41 is applied to surface acoustic wave filter generally designated 42 of the type discussed hereinbefore. The output of filter 42 is electrically connected in series to a differential amplifier 43 wherein the signal due to the surface waves are amplified and the parasitic signals are canceled. By this series arrangement, the adjacent channel rejection may be made greater than 50dB. In order to further reduce the sidelobe amplitude, the output transducers 11 and 12 are designed to have their zeros coincide with the sidelobe maxima of the central input transducer 10. This is accomplished as can be seen from equation (1), by setting the number of finger pairs in the input transducer 10 equal to three halves times the number in the outer transducers 11 and 12. If, in addition, the zeros of one filter fall on the sidelobe of another, the adjacent channel rejection can be made superior to that obtained with conventional LC filters. Two experimental designs have been constructed and tested, the first had 12 finger pairs in the input transducer and eight finger pairs in the two output transducers. The second system included 15 finger pairs in the input transducer and 10 finger pairs in the output transducers.

The periods and number of finger pairs of the transducers are chosen to cause the trap frequencies, (those frequencies for which transmission is minimum) to be close to the required trap frequencies; for example for a television intermediate frequency filter, at 39.75MHz (adjacent channel picture carrier), and 47.25MHz (adjacent channel sound carrier). The sound carrier at 41.25MHz is positioned at the steep slope of the characteristic such that it is attenuated by about 36dB with respect to the maximum.

The periods are calculated using different velocities of the surface acoustic waves in the gaps between fingers (the free surface velocity) and under the metal fingers (the "shorted" velocity). As is known, for YZ cut lithium niobate, the free surface velocity $v_f$ is 3.47 × 10⁵ cm/sec and the shorted velocity $v_s$ is 3.40 × 10⁵ cm/sec. Let fo be the desired center frequency, and let the finger widths and spacing be FW and FS respectively. Then the relation between $fo$, FW and FS is obtained by requiring that the phase shift in a period is $2\pi$ radians or $$2(2\pi fo/v_f\, FS + 2\pi fo/v_s\, FW) = 2\pi \quad (3)$$

If the ratio of finger width to spacing is R, it can be shown from (3) that $$f_o = (1/2FS)(1/(1/v_f + R/v_s)) \quad (4)$$

For the particular case that $FW = FS = \lambda/4$, where λ is the period, $$f_o = (2/\lambda)\,(1/(0/v_f + 1/v_s))\ (5)$$

Equation (4) indicates that the center frequency can be varied for a given period by changing R. This can be used to trim a design with a particular period to confom more closely to the specified characteristic.

The separation between transducers is chosen so as to enhance the output at some desired frequency, such as the picture carrier at 45.75MHz. This enhancement is achieved by requiring that the phase difference between the direct signal and the triple transit echo (TTE) (i.e., the signal which is reflected back to the central transducer and then once more to the outer transducer) is an integral number times $2\pi$ radians at the desired frequency. Let $d$ be the distance between the adjacent edges of the central and outer transducers (assumed the same for both), $n_c$ and $n_o$ the number of finger pairs in the central and outer IDT respectively, $FW_c$ and $FS_c$, $FW_o$ and $FS_o$ the finger width and spacing for the central and outer IDTS and $v_f$ and $v_s$ the 'free' and 'shorted' surface wave velocities respectively. Then the condition for constructive interference at f between the direct and TTE signal is:

$$m = 2f\,((d/_f^v) + (2/_s^v)(n_c FW_c + n_o FW_o) + (1/v_x)). \quad (6)$$

$$((n_c - 1/2)FS_c + (n_o - 1/2)\,FS_o)$$

where $m$ is an integer large enough so that the transducers do not overlap, i.e., $d > o$.

The equivalent series resistance of an IDT according to the circuit model is $R_a = 2K^2/\pi^2\,(v/\lambda)\,C_s$ ohms (7) where $C_s$ is the capacitance of a single finger pair, $k$ is the electromechanical coupling constant, $v$ the surface wave velocity, and λ the period.

By way of example, two filters were tested using YZ lithium niobate as a substrate using the following design formulae:

$c_s \approx 5.4\ FL\ pf$/period, $v = 3.4 \times 10^5$ cm/sec and $k^2 = 4.9 \times 10^{-2}$ where FL is the finger overlap length, so that $$R_a = 5.4 \times 10^3 / (FL/\lambda)\ \text{ohms} \quad (8)$$

Equation 8 is used to choose the finger length giving the desired equivalent series resistance. For example, for $R_a = 50$ ohms, $FL = 108\lambda$. Using the above design formulae, a pair of filters were designed and then tested. For one, the central transducer had 12 pairs of electrodes and the outer transducers had eight, while for the other, the central transducer had 15 pairs of fingers and the outer transducers had 10. For both filters the finger width to spacing ratio was nominally unity, the period was approximately 3 mils and the electrode overlap was approximately 25 periods giving a radiation resistance of about 200 ohms. The filters described hereinbefore may be serially arranged as shown in FIG. 2.

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims.

What is claimed is:

1. A solid state filter comprising:

a. an acoustic surface wave propagating medium;

b. an input transducer having upper and lower interleaved combs of electrodes, the number, size and spacing of said electrodes being selected for predetermined trap frequencies, and responsive to an applied signal for launching bi-directional surface waves in said medium; and c. two output transducers each having upper and lower interleaved combs of electrodes, the number size and spacing of said electrodes being selected for predetermined trap frequencies, said output transducers symmetrically arranged about said input transducer coupled to a second and third portion of said medium and responsive to said bi-directional acoustic surface wave launched therein for producing two output signals which are 180° out of phase, said lower comb of said input transducer is electrically connected to ground potential and to both of said upper combs of said output transducers, and said output transducers have the same number of electrodes and said input transducer has three halves times the number of electrodes of either output transducer.

2. The filter of claim 1 wherein said medium is lithium niobate.

3. The filter of claim 1 wherein said medium is a YZ cut of lithium niobate.

4. The filter of claim 3 wherein the ends of said medium are cut at an angle substantially equal to arctan 0.5 to reduce reflections from the ends.

5. The filter of claim 4 wherein the angle cut ends are covered with an acoustic attenuating material.

6. A solid state intermediate frequency filter for television receivers comprising:

a. an acoustic surface wave propagating medium;

b. an input transducer having upper and lower interleaved combs of electrodes, the number, size and spacing of said electrodes being selected for predetermined trap frequencies, said input transducer coupled to a first portion of said medium and responsive to an applied signal for launching bi-directional surface waves in said medium, said lower comb of said input transducer electrically connected to ground potential;

c. two output transducers each having upper and lower interleaved combs of electrodes, the number, size and spacing of said electrodes being selected for predetermined trap frequencies, each of said output transducers being mirror images of each other about the midline of said input transducer, both of said upper combs of said output transducers electrically connected to said lower comb of said input transducer, said output transducers coupled to a second and third portion of said medium and responsive to said bi-directional acoustic surface wave launched therein producing a parasitic signal and two output signals, said output signals being 180° out of phase; and d. a differential amplifier electrically connected to said output transducers for enhancing said output signals and cancelling said parasitic signal.

7. The filter of claim 6 wherein said output transducers have the same number of electrodes and said input transducer has three halves times the number of electrodes of either output transducer.

8. The filter of claim 7 wherein the ends of said medium is cut at an angle substantially equal to arctan 0.5 to reduce reflections from the ends.

9. The filter of claim 6 wherein the number of electrodes in each of said output transducers is 24 and the number of electrodes in said input transducer is 16.

10. The filter of claim 6 wherein the number of electrodes in each of said output transducers is 30 and the number of electrodes in said input transducer is 20.

11. A solid state intermediate frequency filter for television receivers comprising:

a. a first acoustic surface wave medium;

b. a first input transducer having upper and lower interleaved combs of electrodes, the number, size and spacing of said electrodes being selected for predetermined trap frequencies, said first input transducer coupled to a first portion of said first medium and responsive to an applied signal for launching bi-directional surface waves in said first medium, said lower comb of said first input transducer electrically connected to ground potential;

c. a first and second output transducer each having upper and lower interleaved combs of electrodes, the number, size and spacing of said electrodes being selected for predetermined trap frequencies, each of said output transducers being mirror images of each other about the midline of said first input transducer, both of said upper combs of said output transducers electrically connected to said lower comb of said first input transducer, said first and second output transducers coupled to a second and third portion of said first medium and responsive to said bi-directional acoustic surface wave launched therein producing a parasitic signal and two output signals, said output signals being 180° out of phase;

d. a first differential amplifier electrically connected to said first and second output transducers for enhancing said output signals and cancelling said parasitic signal;

e. a second acoustic surface wave propagating medium;

f. a second input transducer having upper and lower interleaved combs of electrodes, the size, number and spacing of said electrodes being selected for predetermined trap frequencies, said second input transducer coupled to a first portion of said second medium and electrically connected to said first differential amplifier for launching a bi-directional surface wave in said second medium, said lower comb of said second input transducer electrically connected to ground potential;

g. a third and fourth output transducers, each having upper and lower interleaved combs of electrodes, the number, size and spacing of said electrodes being selected for predetermined trap frequencies, each of said third and fourth transducers being mirror images of each other about the midline of said second input transducer, both of said upper combs of said third and fourth output transducers electrically connected to said lower comb of said second input transducer, said third and fourth output transducers coupled to a second and third portion of said second medium and responsive to said bidirectional acoustic surface wave launched therein producing a parasitic signal and two output signals, said output signals being 180° out of phase; and h. a second differential amplifier electrically connected to said output transducers for enhancing said output signals and cancelling said parasitic signal of said third and fourth output transducer.

12. The filter of claim 11 wherein the number of electrodes in said first and second output transducer is 24, the number of electrodes in said first input transducer is 16, the number of electrodes in said third and fourth output transducer is 30 and the number of electrodes in said second input transducer is 20.

13. A surface wave device having a substrate for propagating acoustic waves, an input transducer positioned on said substrate and having first and second interweaved combs of electrodes formed of electrically conductive material, and first and second output transducers positioned on said substrate on opposite sides of said input transducer and each having first and second interweaved combs of electrodes formed of said electrically conductive material, said input transducer having an opposite orientation from the first and second output transducers, the improvement comprising first and second conductors of said electrically conductive material formed on said substrate and connected from said first combs of electrodes of said input transducer to said first combs of electrodes of said first and second output transducers, respectively, said first and second conductors extending along the surface of said substrate and through regions which are between said first and second output transducers and said input transducer, respectively, and providing a common electrical connection between said first combs of electrodes of said input and output transducers.

14. The device of claim 13 wherein the center of said input transducer has a bottom comb grounded which is commected by said conductors to the top combs of said output transducers, said conductors being symmetrically disposed with respect to the input transducer.

15. The device of claim 13 wherein said first conductor is connected between said input transducer and to an end of one of said electrodes of said first output transducer, said electrode being the one which is closest to said input transducer.

* * * * *